(12) United States Patent
Xie et al.

(10) Patent No.: US 8,385,047 B2
(45) Date of Patent: Feb. 26, 2013

(54) INTEGRATED POWER PASSIVES

(75) Inventors: Huikai Xie, Gainsville, FL (US); Khai D. T. Ngo, Blacksburg, VA (US)

(73) Assignee: University of Florida Research Foundation, Inc., Gainesville, FL (US)

(*) Notice: Subject to any disclaimer, the term of this patent is extended or adjusted under 35 U.S.C. 154(b) by 563 days.

(21) Appl. No.: 12/295,347

(22) PCT Filed: Apr. 2, 2007

(86) PCT No.: PCT/US2007/065773
§ 371 (c)(1),
(2), (4) Date: Aug. 25, 2009

(87) PCT Pub. No.: WO2007/115255
PCT Pub. Date: Oct. 11, 2007

(65) Prior Publication Data
US 2010/0020509 A1    Jan. 28, 2010

Related U.S. Application Data

(60) Provisional application No. 60/788,034, filed on Mar. 31, 2006.

(51) Int. Cl.
*H01G 4/228* (2006.01)

(52) U.S. Cl. ............... 361/306.3; 361/306.1; 361/306.2; 361/311; 361/312; 361/313; 174/257

(58) Field of Classification Search .................. 174/257; 361/311–313, 306.1–306.3
See application file for complete search history.

(56) References Cited

U.S. PATENT DOCUMENTS

| | | | | |
|---|---|---|---|---|
| 5,021,920 A * | 6/1991 | Smith | ........................... | 361/311 |
| 5,912,485 A * | 6/1999 | Chao | ............................. | 257/308 |
| 6,107,137 A | 8/2000 | Fazan et al. | | |
| 6,136,660 A * | 10/2000 | Shen et al. | .................... | 438/386 |
| 6,146,963 A * | 11/2000 | Yu | ................................. | 438/396 |
| 6,229,166 B1 * | 5/2001 | Kim et al. | ..................... | 257/295 |
| 6,265,740 B1 * | 7/2001 | Kim | ............................... | 257/296 |
| 6,569,689 B2 * | 5/2003 | Marsh | ................................ | 438/3 |
| 6,897,508 B2 * | 5/2005 | Sneh | ............................... | 257/301 |
| 6,974,985 B2 * | 12/2005 | Kurasawa et al. | ............ | 257/296 |
| 2004/0223290 A1* | 11/2004 | Sutardja | ..................... | 361/306.3 |
| 2006/0120020 A1 | 6/2006 | Dowgiallo et al. | | |

* cited by examiner

*Primary Examiner* — Hung S Bui
*Assistant Examiner* — James Wu
(74) *Attorney, Agent, or Firm* — Saliwanchik, Lloyd & Eisenschenk

(57) ABSTRACT

A multi-layer film-stack and method for forming the multi-layer film-stack is given where a series of alternating layers of conducting and dielectric materials are deposited such that the conducting layers can be selectively addressed. The use of the method to form integratable high capacitance density capacitors and complete the formation of an integrated power system-on-a-chip device including transistors, conductors, inductors, and capacitors is also given.

8 Claims, 4 Drawing Sheets

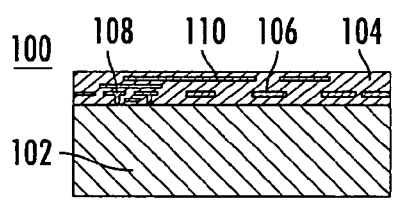
FIG. 3A  CMOS CHIP
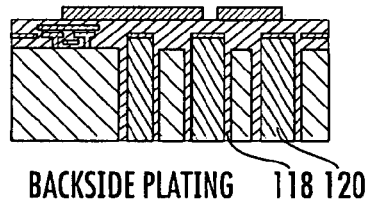
FIG. 3D  BACKSIDE PLATING
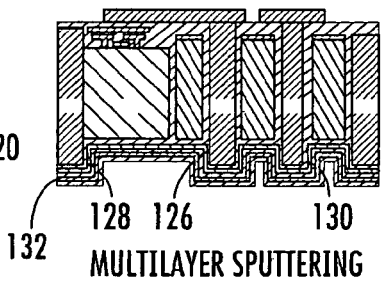
FIG. 3G  MULTILAYER SPUTTERING
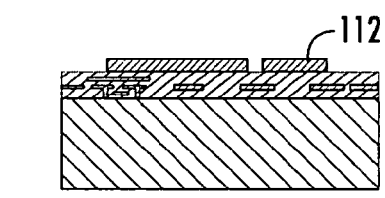
FIG. 3B  FRONTSIDE PLATING
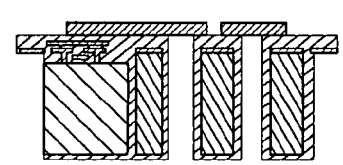
FIG. 3E  SELECTIVELY ETCH
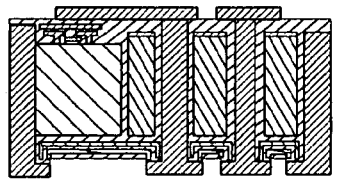
FIG. 3H  CAPACITOR FORMATION USING THE PROCESS IN FIG. 4
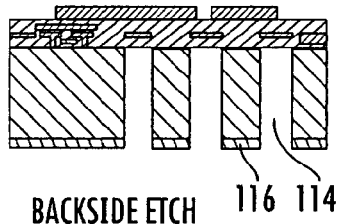
FIG. 3C  BACKSIDE ETCH
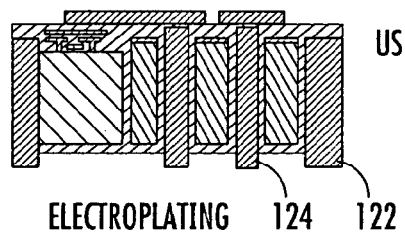
FIG. 3F  ELECTROPLATING

INTEGRATED POWER PASSIVES

CROSS-REFERENCE TO RELATED APPLICATIONS

This application is the U.S. national stage application of International Patent Application No. PCT/US2007/065773, filed Apr. 2, 2007, which claims the benefit of U.S. Provisional Patent Application Ser. No. 60/788,034, filed Mar. 31, 2006, the disclosures of which are incorporated by reference herein in their entirety, including any figures, tables, or drawings.

The subject invention was made with government support under a research project supported by National Science Foundation, Contract No. ECS0601294 and a grant supported by NASA, Contract No. NNG05K00H (Subgrant of UCF#01000012778). The government may have certain rights to this invention.

FIELD OF THE INVENTION

The invention relates to the fabrication of multilayer film-stack, high energy density capacitors, and integrated devices therefrom.

BACKGROUND

Monolithic integration has emerged to reduce cost and to improve transient performance of power converters including dc-dc converters. There have been feasibility studies, and calculations suggested that power density exceeding 1000 W/cm$^2$ is feasible at efficiency above 80%. State-of-the-art power density, however, currently has not exceeded 20 W/cm$^2$ at output power above 10 W. To increase the power density of an integrated dc-dc converter requires micro-fabrication of inductors and capacitors referred to as power passives on the processor chips instead of requiring off-chip inductors and capacitors. There are presently no known practical fabrication techniques for fabricating power passives with high energy density. Other requirements for improving the power density and transient performance of dc-dc converters are design optimization, circuit topologies, magnetic geometries, materials, packaging, and thermal management, if a significant improvement above the state of the art 10 W power level and 20 W/cm$^2$ power density are to be realized. Furthermore, many applications of power converters require high current capacity (~10 A) and high inductance (~µH).

Micro-electro-mechanical systems (MEMS) technology is an emerging technology which leverages IC technology to make micro-scale devices and systems. Numerous MEMS inductor designs have been reported where the main effort was focused on reducing losses. Several power loss mechanisms in an inductor exist, including: copper loss due to the resistance of the copper wire windings; core loss due to hysteresis and eddy currents in the core; eddy current loss due to a non-insulator substrate; dielectric loss; and electromagnetic radiation. Copper loss can be reduced by using thick copper layers which are normally obtained by employing deep polymer trenches. Core loss can be reduced by using lamination techniques. Substrate eddy current loss has been reduced through various methods, such as undercutting substrate, lifting the inductor structure above the substrate, or bending it out of plane. Dielectric loss and EM radiation are generally negligible.

There are many issues to be solved with MEMS inductors. Silicon-based micro-inductors offer the advantage of integratability with active electronics, but substrate loss and parasitic capacitances limit the achievable Q. Mechanical robustness is a concern if the substrate is removed or the microstructure is hung above or out of the substrate, where packaging difficulties must be addressed. Fabrication using microwave plasma ashing to remove thick polymer (>150 µm) such as SU-8 is time-consuming and can have undesired side effects especially on CMOS substrates. Because of the skin effect, increasing the copper line width may not yield low ac resistance at high frequency. Low inductance and low current handling because of winding resistance and core saturation should be improved upon and problems of thermal dissipation should be addressed.

Besides output capacitors, power supplies also need capacitors with large capacitance. To reduce the capacitor size, high capacitance-density capacitors are needed. High capacitance-density capacitors have been reported using V-grooves, multilayer stacks or high-k dielectrics. Ferroelectric dielectric materials (e.g., BST, PZT) have very high dielectric constants in the order of thousands. However they need high-temperature (>600° C.) annealing in oxygen and their dielectric constants decrease with DC bias and frequency. Paraelectric dielectrics (e.g., AlN, Ta$_2$O$_5$) are much more stable and can be deposited at low temperature, but their dielectric constants are only up to 50. A MIM capacitor with 1.7 µF/cm$^2$ capacitance density was demonstrated using Nb$_2$O$_5$. Creating nanometer-scale shallow trenches on silicon can greatly increase the capacitance density and 3.13 µF/cm$^2$ has been reported. The capacitance density achieved so far using multiple Ta$_2$O$_5$ layers is only about 440 nF/cm$^2$ since the number of dielectric layers was limited to two. Using multilayer stacks to obtain high capacitance density seems to be an obvious approach to increase capacitance density, but the state of the art method to electrically connecting tens of layers separately requires an equal number of photolithography steps. This approach to is very complicated and very expensive.

A cross sectional view of a portion of a state-of-art integrated power converter 50 is shown in FIG. 1 where the converter 50 includes a CMOS layer 58. The power converter chip has integrated inductors, but no integrated large value capacitors. More specifically, the copper forming inductors 52 are imbedded in a insulating material 54 disposed on top of a silicon substrate 56 and the output capacitors are not integrated. The converter of FIG. 1 achieves only a moderate power density. Hence, the goal of an integrated dc-dc converter with improved power density remains unfulfilled. To achieve this goal a new method of fabricating power passives and corresponding structures is needed to achieve CMOS compatibility, high energy density and a small footprint.

SUMMARY OF THE INVENTION

A multilayer film-stack, includes a substrate; a series of alternating dielectric and electrically conducting layers disposed on the substrate, wherein the area of the layers monotonically decreases as a distance from the substrate increases; and electrical connections coupled to two or more of the conducting layers. The individual conducting layers can be two or more different conducting materials. The multilayer film-stack can be a programmable capacitor. The programmable capacitor can further include an electrical circuit disposed on the substrate having an output coupled to the capacitor. The electrical circuit coupled to the capacitor can be a voltage regulator. The voltage regulator can be a dc-dc voltage regulator. The device can also include an inductor formed on the substrate with the inductor coupled to the capacitor.

A method for forming a multilayer film-stack including the steps of: providing a substrate; forming at least one plateau region on the substrate; depositing a series of alternating dielectric layers and conducting material layer on the substrate including over the plateau regions where the first and last layers can be selected to be either a dielectric layer or a conducting material layer, and the dielectric layers can be the same or different materials and the conducting material layers can be the same or different materials; removing the top surface to expose at least one of the plateaus and two or more edges of the conducting material layers; addressing two or more of the edges selectively in the vicinity of at least one of the plateaus; and depositing selectively at least one connecting conductive layer contacting some or all of the selected edges such that electrical connectivity can be made in and out of the multilayer film-stack. The step of removing can involve removal processes including mechanical polishing, chemical mechanical planarization, electric discharge machining or ion milling. Particularly for thin layers of about 50 nm or less, the step of addressing can include the steps of: etching a portion of the edges of a selected conducting material when two or more conducting materials are deposited; depositing a dielectric layer wherein the voids resulting from etching are filled; and removing the dielectric to expose the edges of the conductive material that was not etched. Alternately for thicker layers of about 100 nm or more, the step of addressing can be a photolithographic process. The connecting conductive layer can be selectively deposited by sputtering a conducting material using a shallow mask on the area above selected plateaus.

The method of forming a multilayer film-stack can be used to form high capacitance density capacitors when the step of depositing a series of the dielectric layers and the conducting material layers are repeated wherein the dielectric layer, a first conducting material, the dielectric layer, and a second conducting material are successively deposited until a predetermined number of dielectric layers and conducting material layers have been deposited. The first and second conducting materials can be chosen to have different properties such as etching rates and can be, for example, aluminum and titanium, respectively. Furthermore, a feature that is an electrically conductive material can be selectively deposited on the area and around at least one of the plateaus by sputtering using a shadow mask.

The formation of the capacitor by the method of forming a multilayer film-stack can be included in the formation of a power system-on-a-chip (SoC) that including at least one transistor, at least one conductor, at least one inductor and at least one capacitor, where the substrate and the one or more plateaus are features of an inductor formed by the steps of: providing a complementary metal oxide semiconductor (CMOS) circuit having a frontside oxide layer having at least one metal layer disposed therein and having a backside silicon layer; forming at least one trench originating from the backside of the substrate through the substrate to the frontside oxide layer; depositing a dielectric coating on the walls of the trench; etching anisotropically the dielectric coating and oxide layer at the base of the trenches to expose at least one of the disposed metals in the frontside oxide layer; depositing a magnetic core material in the trenches, wherein the dielectric coating surrounds the core material. The method also includes a dielectric layer on the backside surface including the exposed core material; etching from the backside at least one portion of the dielectric layer, the silicon layer and anisotropically etching the adjacent frontside oxide layer to expose at least one metal layer deposited on the frontside oxide layer to form open channels surrounding the core material; and depositing a metal in the open channels surrounding the core material, wherein an inductor is formed with the metal extending to the metal disposed in the frontside oxide layer and where the backside ends of the metal are the plateaus. Steps can be included to pre-treating any of the exposed metals prior to the deposition of the metal where pre-treatment is the formation of an adhesion layer over the exposed portion of the metal. Steps to frontside etch the oxide to reveal exposed metal; and deposit a metal onto the exposed metal can be included. Steps to form at least one deep trench originating from the backside of the substrate into or through the substrate and optionally through the oxide to metal disposed in the oxide layer; and to deposit a metal in the trench can be included to form a thermal plug to aid in heat dissipation from the SoC. A step to planarize the backside surface after depositing the magnetic core material can be included. The magnetic core material can be permalloy.

BRIEF DESCRIPTION OF THE DRAWINGS

There is shown in the drawings embodiments which are presently preferred, it being understood, however, that the invention can be embodied in other forms without departing from the spirit or essential attributes thereof.

FIG. 3 shows a process according to an embodiment of the invention for inductor fabrication and/or integrated LC filter fabrication starting from a CMOS chip including a series of steps (a) through (h) along with associated cross structural views as indicated.

DETAILED DESCRIPTION

The invention involves a new fabrication process and associated devices that are CMOS-compatible and enable monolithic integration of high-Q, high-inductance, high-current-handling inductors and high-density capacitance capacitors, such as for power electronic circuits. The invention is enabled by a novel process to prepare a multilayer film-stack such that a stack of conducting layers separated by dielectric layers are formed over a substrate having one or more elevated plateaus above a surface of the substrate and upon removing a portion of the layers generally to about the surface of at least one of the plateaus, which permits the selective addressing of conducting layers. Selective addressing as used herein is the connection of some but not all of the conductive layers. For very thin layers, selective addressing can be carried out by using two or more different conducting layers and selectively etching one or more of the conducting layers and effectively filling the volume remove upon etching with a dielectric. The details of the method of preparing such a multilayer film-stack will be described as the final fabrication steps to yield a capacitor for an embodiment of the invention that provides a fully integrated dc-dc power converter that can operate at a high frequency (e.g. 10 MHz or higher) and can handle high currents (e.g. 5 A). Inductors according to the invention use deep trenches in a silicon or other substrate as a first electroplating mold; and then the substrate is selectively removed and the plated material is used as a second mold. In this manner thick copper, or another metal, and core materials can be formed with dimensions up to the thickness of the substrate, such as a 500 µm silicon wafer. There is virtually no substrate loss and no special process steps needed in contrast to those required for thick polymer molding processes. Thermal plugs can be included in the resulting structure to mitigate heating problems.

Figure 1:
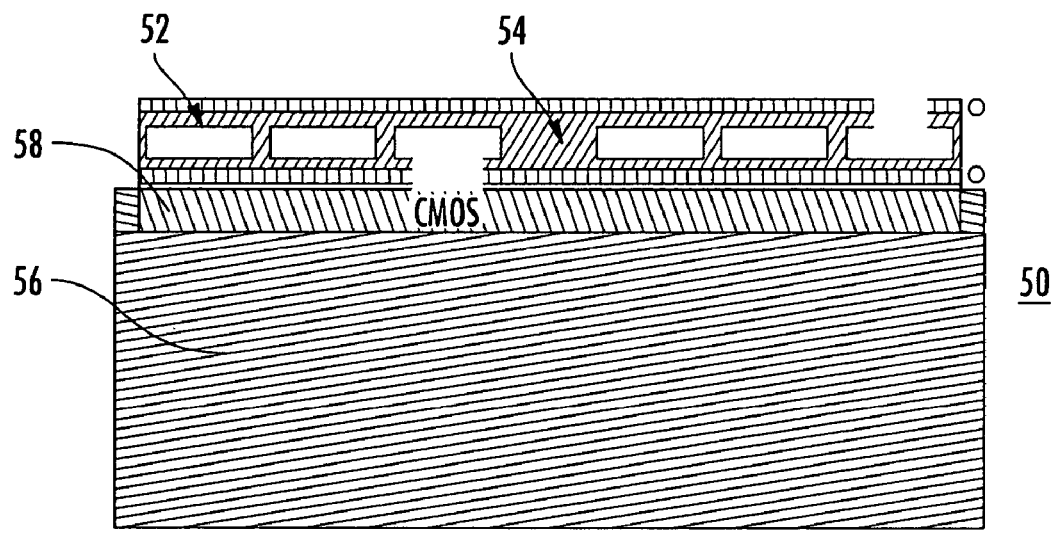
FIG. 1 shows a cross sectional view of a portion of a conventional state of the art integrated dc-dc converter that includes an on-chip inductor.
Figure 2A:
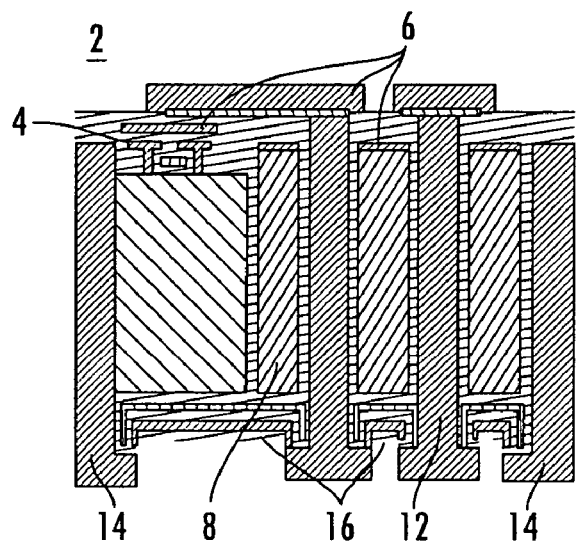
FIG. 2 shows (a) a side view of the salient features of an integrated dc-dc converter employing a substrate-molded filter and (b) a schematic of the monolithic dc-dc converter in (a) showing output inductors and output capacitor.

FIG. 2(a) illustrates a system-on-a-chip (SoC) 2 which is a power converter according to an embodiment of the invention, a portion of schematically shown in 2(b) that can be fabricated starting with a CMOS chip which provides one or more transistors 4 using the method of the present invention. Many advantages result from the method of fabrication. The substrate-molded conductor 6 and inductor core 8 can be as deep as the thickness of the substrate 10, typically between 50 µm and 500 µm, permitting a much larger cross-section areas than available in a state-of-the-art conductor and core. Larger cross sectional area allows more current to be carried and/or higher voltage to be supported, resulting in a higher power rating and/or a higher power density. Generally, only two post-CMOS masks are needed in the fabrication. CMOS interconnect metal layers 12 form most of the patterns and realize self alignments. Thermal plugs 14 can be embedded in the substrate, as shown in FIG. 2(a) to facilitate the removal of heat generated in the chip body. The magnetic field in a substrate-molded inductor can be designed to flow parallel to the chip surface, which reduces the losses and interference associated with magnetic flux cutting into silicon. The substrate volume can also accommodate high value output capacitors 16, leading to a higher level of integration and faster transient response compared to that of state of the art devices. The entire device is solid and robust with no need for complicated packaging.

Figure 2B:
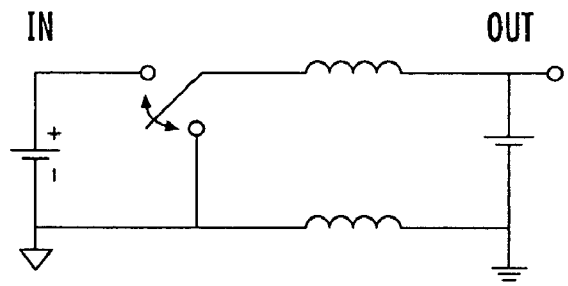

High-aspect-ratio silicon trenches can be formed using deep-reactive-ion-etch (DRIE) technology to form electroplating molds by etching from the backside of the silicon substrate down to CMOS interconnect layers, such as Al or Cu layers. These Al or Cu layers can be used as initial seed layers for electroplating permalloy to ultimately form a siliconless inductor, such as the inductor 6 illustrated in FIG. 2(a). The only silicon substrate that remains in the converter is underneath the power electronics region, illustrated with a single transistor in FIG. 2, but a portion of it is in contact with one or more copper plugs to promote good thermal dissipation. Only two photomasks and one shadow mask are generally needed for this post-CMOS micromachining process.

One process embodiment of the invention is shown in FIG. 3 where a single chip power converter is formed from a CMOS chip. High value on chip inductors and capacitors is described such as for the output inductor and output capacitor for voltage processors. The process begins with a CMOS wafer which can be fabricated in any commercial CMOS foundry. FIG. 3(a) shows the cross-sectional view of a 400 µm-thick CMOS chip 100 having CMOS devices thereon. The CMOS chip 100 comprises a silicon substrate 102 and a frontside oxide layer 104 with at least one metal layer 106 (first metal layer), 108 (second metal layer), 110 (third metal layer) disposed within the oxide layer 104. The metal can comprise, for example, aluminum, copper or alloys thereof. The frontside oxide 104 is then etched until a metal layer, 110 in this illustration, is exposed. Copper or another metal 112 is then electroplated on the frontside making intimate contact with the exposed metal 110, as shown in FIG. 3b. If the metal 110 is Al, a zincate pre-treatment of its surface is added before the copper electroplating to avoid the electroplating difficulties that are encountered due to an aluminum oxide layer that may exist or form upon exposure of the Al. The zincate process forms a thin zinc layer to which copper has good adhesion, and is well known to one of ordinary skill in the art. This metallization of the CMOS metal features is carried out to thicken the metal from that normally found in a CMOS structure and does not have to be carried out as the first step of the fabrication sequence. This metallization of the metal features within the frontside oxide is carried out to complete the winding geometry of the inductor whose connectivity is predetermined by the geometry by which the CMOS chip has been fabricated.

Deep reactive ion etching (DRIE) is carried out to form one or more trenches 114 on the backside of the CMOS wafer, as shown in FIG. 3(c). Photoresist 116 or an oxide layer may be used as etching masks. This silicon etch stops on the frontside oxide layer 104, but a subsequent anisotropic dielectric etch is performed from backside to expose a metal layer 106 (e.g. aluminum). The positioning of the trenches 114, as will be readily appreciated by one of ordinary skill in the art, can be determined using etching combined with a mask 116. The mask layer 116 can then be removed, for example, in the case of photoresist, the photoresist can be removed using an oxygen plasma.

The trenches can then be coated with a dielectric layer 118. For example a silicon dioxide layer can be deposited via plasma-enhanced chemical vapor deposition (PECVD). The oxide at the bottom of the trenches 114 can be removed using an anisotropic dielectric etch to expose a metal 106 disposed in the frontside oxide.

In this illustration, the electroplating of a magnetic core material 120 (e.g. permalloy) is then carried out and the backside is polished via chemical-mechanical polishing (CMP), if necessary. PECVD of an oxide is then applied to the backside and patterned to expose the inductor area.

The substrate 102 around the Permalloy 120 whose sidewalls are oxide coated 118 is preferably removed by DRIE. An anisotropic oxide etch to remove the oxide 118 and 104 on the distal end of the trench and an oblique oxide sputtering to passivate the permalloy results in the structure illustrated in FIG. 3(e).

The structure of FIG. 3(f) results by backside copper electroplating 122, preferably with Cu, but other metals can be used. Zincate treatment to promote bonding of the metals is carried out before the electroplating if aluminum is used as the CMOS interconnect metal. This process step leaves a series of metal plateaus 124 which extend beyond the backside surface prior to electroplating.

The formation of one or more high capacitance value capacitors that complete the integrated power converter begins by creating an alternating multilayer stack by successive deposition of a dielectric layer 126, a first conductive layer 128, a dielectric layer 130 and a second conductor layer 132 on the backside to give the structure illustrated in FIG. 3(g). By a process of polishing, selective etching, deposition of a dielectric and conductors on the backside, as is detailed below and shown in FIG. 4, an on-chip capacitor with high capacitance density is formed to complete the single chip integrated power converter shown in FIG. 3(h). Both high value capacitors and high value inductors according to the invention can thus be formed on the same chip.

Advantages of the invention are numerous. High-aspect-ratio substrate structures are used as molds and sacrificial layers. Thick copper or other material lines permit the achievement of low series resistance (i.e., high Q) and passing high current. No substrate remains underneath the inductor. Thermal plugs are included to achieve improved thermal dissipation. The structures are robust which permits easy packaging of devices. Finally the monolithic filters with large inductors and capacitors are integrated on the same chip as the electrical device.

FIG. 3 is just one example of a process sequence of the invention used to illustrate the concept of molding using a substrate, such as a silicon substrate. There are many possible processing variations. For example, the substrate mold can be used for windings (copper) first, then electroplating the core (permalloy). A process step including a third mold can also be easily added. This method can be used to produce transformers as well as inductors.

Figure 5:
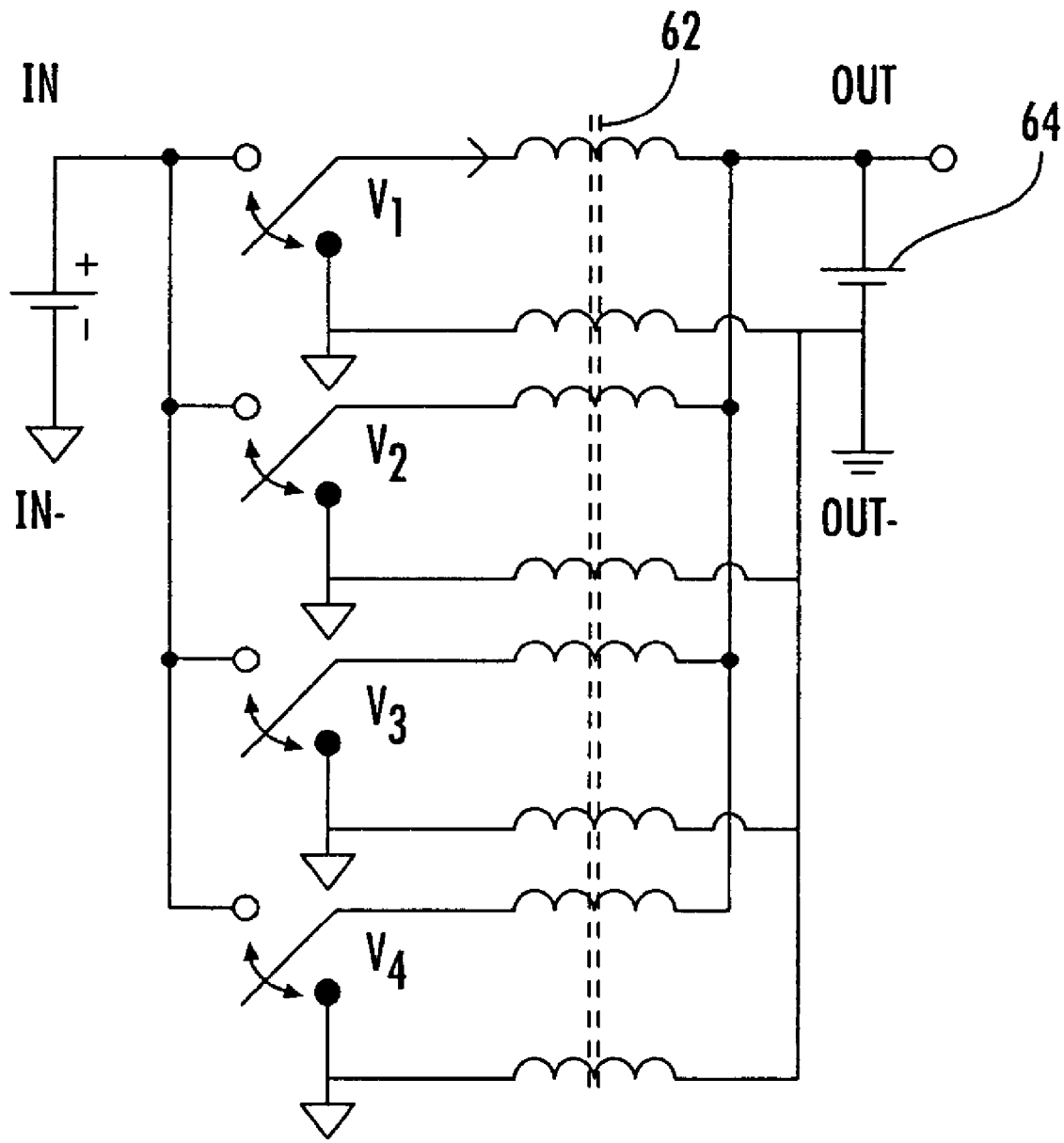
FIG. 5 shows a circuit schematic of an integrated dc-dc converter according to an embodiment of the invention.

Coupled inductors can also be fabricated using the invention. A multiphase dc-dc converter topology emphasizing the output portion is depicted in FIG. 5, where capacitor 64 and four coupled inductors 62 are shown. When the inductors are tightly coupled, the currents in the phases are in phase, and calculation shows that the ac winding loss is manageable even if the ac current is assumed to flow within one skin-depth from the surface.

Performance of coupled inductors of this embodiment of the invention shown was simulated using a two-dimensional field solver with MAXWELL® software by Ansoft Corporation. A 0.2 mm core/substrate thickness and a relative permeability of 400 throughout the core was found to yield about 22.4 nH for four inductors of about 5.6 nH in parallel for the converter. When all four quadrants are excited in-phase, the flux is less than 6 mT for a current flow of 1.25 A in each phase. The cells are de-coupled and can be modeled by two inductors as in I. G. Park and S. I. Kim, "Modeling and analysis of multi-interphase transformers for connecting power converters in parallel," *Record of Power Electronics Specialists Conference*, 1997, pp. 1164-1170. Table 1 summarizes some simulation key results for the inductor according to the invention. The inductor loss of 104 mW is less than 1% of the output power of 12 W.

surface in a controlled fashion will expose all the coating layers where the layers have been directed out of plane by the presence of the plateaus such that the layers can be selectively addressed. Polishing can be carried out by any mean where the depth of removal can be controlled including mechanical polishing, chemical mechanical planarization, and ion milling. Appropriate methods will depend upon the materials employed and other processing parameters as can be appreciated and selected by one skilled in the art. The conducting materials for the two capacitor electrodes can have different chemical properties, particularly for the preparation of capacitors with particularly small feature different etching rates. There are many possible combinations of conducting material pairs. For example, heavily-doped polysilicon and aluminum can be selectively etched, and thus can be used as the conducting material pair. Many other conductors can be used as known to those skilled in the art including titanium copper, and indium tin oxide (ITO). Tens or even hundreds of layers can separately be electrically connected to form a single capacitor using only one or two photomasks. Selectively addressing by a process including selective etching is particularly useful for low voltage applications when the thickness of the layers are less than about 50 nm and as small as about 1 nm. Where larger layers, greater than about 50 nm, are preferable, for use in high voltage applications, the selective addressing can be performed by photolithographic means as well as by a selective etching approach.

The capacitor via a multilayer film-stack of the integrated dc-dc power converter embodiment is fabricated using the multilayer stack. The thickness of the dielectric layers depends on the deposition process and also the surface roughness. A deposition thickness of 50 nm is used for example calculations in this embodiment to ensure no breakdown. When a relatively low maximum voltage is chosen (~3.3V), the dielectric layer may be much thinner. The thickness of the conducting layers has some constraints depending on the deposition process used. The thickness of the conducting layers of 50 nm for this embodiment yields an average thickness of each parallel-plate capacitor of 100 nm. The deposition of 101 alternating metal and dielectrics layers yields 50 pairs of parallel plates. For a capacitor having a 2 mm by 2 mm surface area, the capacitance will be up to 1.7 µF, which is about 425 nF/mm$^2$, or 42.5 µF/cm$^2$. This capacitance density can be even higher by employing thinner dielectric layers and/or a greater number of layers.

The cross-sectional view of an exemplary fabrication process for forming high energy density capacitors is illustrated in FIG. 4. First a plateau 200, either silicon, a metal, a semi-

TABLE 1

Substrate-Molded Inductor Design.

| | | | | | | |
|---|---|---|---|---|---|---|
| Input voltage | 3.3 | V | Saturation flux | 1 Tesla | Height | 200 µm |
| Output voltage | 2.4 | V | Relative permeability | 400 | Outer diameter | 2 mm |
| Output current, dc | 5 | A | Core resistivity | 100 µΩ-cm | Core width | 0.66 mm |
| Ripple current/phase | 2.5 | A p-p | Coercive force | 0.2 oersted | Core lamination | 10 µm |
| Switching frequency | 10 | MHz | Core skin depth | 8 µm | Insulation | 10 µm |
| Ac flux | 0.5 | T | Copper skin depth | 21 µm | | |
| | | | | | Mutual inductance | 5.6 nH |
| Core loss, eddy | 75 | mW | Hysteresis loss | 21 mW | Leakage inductance | 0.4 nH |
| Copper loss, eddy | 3 | mW | Copper loss, dc | 5 mW | Inductor Loss | 104 mW |

Figure 4A:
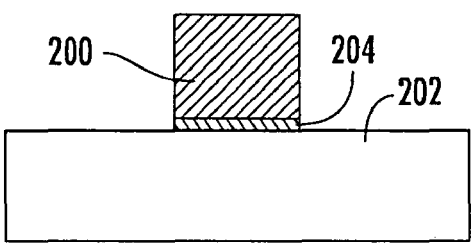
FIG. 4 shows a process according to an embodiment of the invention for the production of a large capacitance-density capacitor including steps (a) through (h) as indicated along with associated cross structural view involving: (a) the formation of a plateau; (b) alternately depositing dielectric, conductor-1, dielectric, conductor-2; (c) polishing the top surface to expose the plateau; (d) selectively etching one of the metals, conductor-1; (e) PECVD depositing a dielectric; (f) etching the dielectric to expose the plateau; and (g) sputtering Al or another metal on the area on and around a plateau selectively by the use of a shadow mask as shown in (h), which forms the first electrode of the capacitor. All conductor-2 layers can be electrically connected in the same manner to form the second electrode of the capacitor.
Figure 4E:
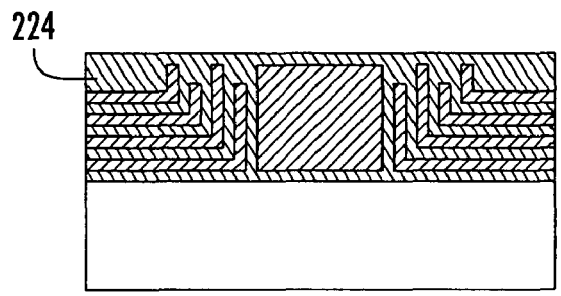
Figure 4B:
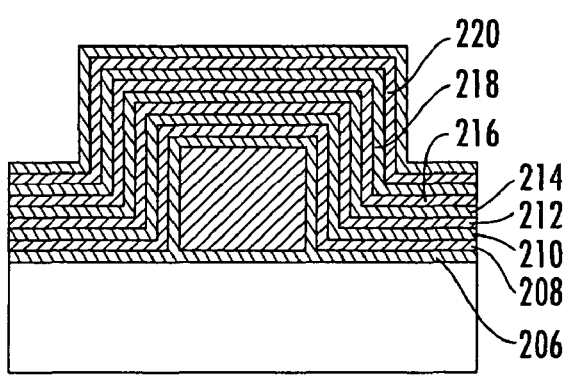
Figure 4F:
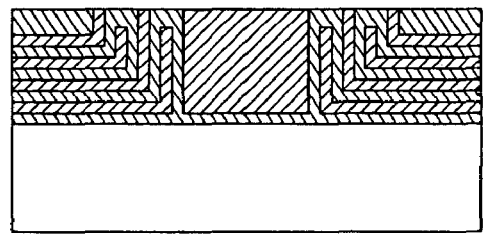
Figure 4C:
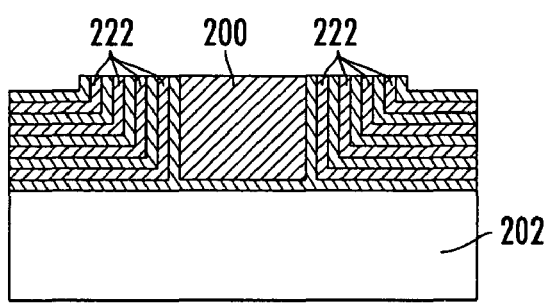
Figure 4G:
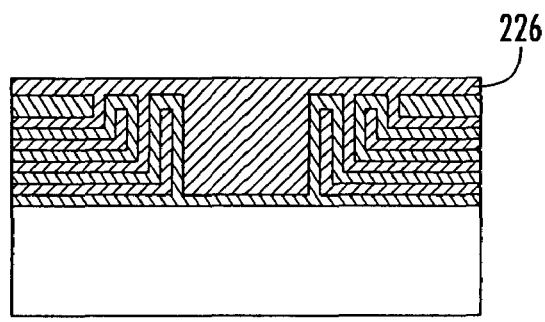
Figure 4D:
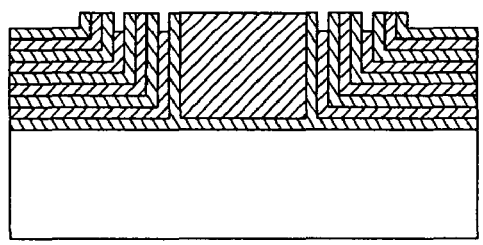
Figure 4H:
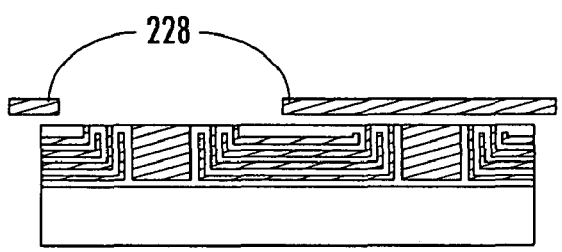

An exemplary method to produce high capacitance density comprises deposition of a multilayer-interconnect structure where multiple alternating layers of dielectric and conducting materials are deposited over a surface which includes plateaus, which upon polishing or other means of removing the conductor, or a dielectric, is formed by deposition or electroplating the plateau or simply etching the adjacent substrate leaving a plateau. As shown in FIG. 4(a) a metal plateau 200 is situated on a silicon substrate 202 with a dielectric 204 between the metal and silicon. For the integrated dc-dc power converter embodiment of the invention, the plateaus are the metal plateaus 124 of FIG. 3(*f*). Following the formation of the plateau, a multi-target CVD or sputtering system is used to deposit alternating layers of a dielectric 206, a first conducting layer 208, a dielectric 210 and a second conductor 212. All the layers can be deposited with a thickness in the order of 50 nm. The resulting structure is shown in FIG. 4(*b*) has two additional depositions of dielectric layers 214 and 218 to separate an additional first conductor layer 216 and an additional second conductor layer 220. When the top surface is subsequently removed by polishing until the plateau is exposed, as shown in FIG. 4(*c*), the conductor layers are exposed at edges 222 at the polished surface as the conformal deposition of the layers oriented the layers perpendicular to the original substrate 202 due to the presence of the plateaus 200. Photolithography may be applied to selectively connect all first conductor layers 208 and 216 and/or second conductor layers 212 and 220. However, when the size of the edges of the conductor and dielectric layers is less than about 100 nm, photolithography becomes prohibitively difficult. By using two capacitor electrodes of different materials, a first conductor and a second conductor, one of the materials, for example the first conductor, can be selectively etched, with the resulting structure shown in FIG. 4(*d*).

PECVD can then be used to deposit an oxide 224, with the resulting structure shown in FIG. 4(*e*), and then etched to expose only the first conductor or second conductor, as illustrated for the exposure of the second conductor in FIG. 4(*f*) where the oxide in the small first conductor trenches remains. This can be obtained by either polishing or by ion milling. When all plateaus have been etched to expose the selected conductor, aluminum or another metal 226 is sputtered on the plateau 200 and its surrounding area, with the resulting structure shown in FIG. 4(*g*), using a shadow mask 228 as shown in FIG. 4(*h*) the second conducting material can be selectively etched at another plateau.

The plateaus can be used directly as bonding pads and this process is CMOS-compatible. The plateau in FIG. 4(*a*) can be formed by electroplating copper or nickel on a CMOS chip. The plateaus can also be insulators or semiconductors, which can be formed by deposition on the substrate or formed by etching of the substrate around a plateau.

It is to be understood that while the invention has been described in conjunction with a preferred specific embodiments thereof, that the foregoing description is intended to illustrate and not limit the scope of the invention. Other aspects, advantages and modifications within the scope of the invention will be apparent to those skilled in the art to which the invention pertains.

We claim:

1. A multilayer film-stack, comprising:
a substrate;
a series of alternating dielectric layers and electrically conducting layers disposed on said substrate, wherein the area of said conducting layers monotonically decreases as a distance from said conducting layer to said substrate increases;
a first electrical connection coupling two or more of said conducting layers to form a first electrode; and
a second electrical connection coupling two or more other of said conducting layers, not of said first electrode, to form a second electrode, wherein said first and second electrodes are electrically and physically separated by said dielectric layers, and wherein said first electrical connection and said second electrical connection reside on a common face of said multilayer film-stack.

2. The film-stack of claim 1, wherein respectively said conducting layers comprise two or more different conducting materials.

3. A programmable capacitor, comprising:
a substrate;
a series of alternating dielectric layers and electrically conducting layers deposed-disposed on said substrate, wherein the area of said conducting layers monotonically decreases as a distanced of said conducting layer from said substrate increases;
a first electrical connection coupling two or more of said conducting layers to form a first electrode; and
a second electrical connection coupling two or more other of said conducting layers, not of said first electrode, to form a second electrode, wherein said first and second electrodes are electrically and physically separated by said dielectric layers, and wherein said first electrical connection and said second electrical connection reside on a common face of said multilayer film-stack.

4. The programmable capacitor of claim 3, further comprising an electrical circuit disposed on said substrate having an output coupled to said capacitor.

5. The programmable capacitor of claim 4, wherein said electrical circuit coupled to said capacitor comprises a voltage regulator.

6. The programmable capacitor of claim 4, wherein said electrical device comprises a dc-dc voltage regulator.

7. The programmable capacitor of claim 4, wherein said device comprises an inductor formed on said substrate said inductor coupled to said capacitor.

8. The film-stack of claim 1, wherein said dielectric layers comprise silicon dioxide.

\* \* \* \* \*